(12) United States Patent
Saputra et al.

(10) Patent No.: US 12,015,110 B2
(45) Date of Patent: *Jun. 18, 2024

(54) FLIP CHIP LED WITH SIDE REFLECTORS ENCASING SIDE SURFACES OF A SEMICONDUCTOR STRUCTURE AND PHOSPHOR

(71) Applicant: LUMILEDS LLC, San Jose, CA (US)

(72) Inventors: Iwan-Wahyu Saputra, Singapore (SG); Yeow-Meng Teo, Singapore (SG)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/892,788

(22) Filed: Aug. 22, 2022

(65) Prior Publication Data

US 2022/0399483 A1 Dec. 15, 2022

Related U.S. Application Data

(63) Continuation of application No. 16/067,016, filed as application No. PCT/US2016/066413 on Dec. 13, 2016, now Pat. No. 11,424,396.

(Continued)

(30) Foreign Application Priority Data

Mar. 15, 2016 (EP) ..................................... 16160421

(51) Int. Cl.
*H01L 33/60* (2010.01)
*H01L 33/46* (2010.01)
(Continued)

(52) U.S. Cl.
CPC .............. *H01L 33/60* (2013.01); *H01L 33/46* (2013.01); *H01L 33/486* (2013.01); *H01L 33/50* (2013.01);
(Continued)

(58) Field of Classification Search
CPC ......... H01L 33/46; H01L 33/50; H01L 33/60; H01L 33/486; H01L 33/505;
(Continued)

(56) References Cited

U.S. PATENT DOCUMENTS 7,274,040 B2 * 9/2007 Sun ........................ H01L 33/405
257/97
7,432,119 B2 * 10/2008 Doan ...................... H01L 33/44
438/33

(Continued)

FOREIGN PATENT DOCUMENTS

EP 1 995 780 11/2008
EP 3076444 10/2016
(Continued)

OTHER PUBLICATIONS

Extended European Search Report dated Sep. 16, 2016 for European Patent Application No. 16160421.0.

(Continued)

*Primary Examiner* — Khiem D Nguyen
(74) *Attorney, Agent, or Firm* — Volpe Koenig

(57) ABSTRACT

An array of light emitting devices is mounted on a support surface with the transparent growth substrate (e.g., sapphire) facing up. A photoresist layer is then deposited over the top surface of the growth substrate, followed by depositing a reflective material over the top and side surfaces of the light emitting devices to encapsulate the light emitting devices. The top surfaces of the light emitting devices are then ground down to remove the reflective material over the top surface of the photoresist. The photoresist is then dissolved to leave a cavity over the growth substrate having reflective walls. The cavity is then filled with a phosphor. The phosphor-converted light emitting devices are then singulated to form packaged light emitting devices. All side light is reflected back into the light emitting device by the reflective (Continued)

material and eventually exits the light emitting device toward the phosphor. The packaged light emitting devices, when energized, appear as a white dot with no side emission (e.g., no blue halo).

19 Claims, 7 Drawing Sheets

Related U.S. Application Data

(60) Provisional application No. 62/272,416, filed on Dec. 29, 2015.

(51) Int. Cl.
   *H01L 33/48* (2010.01)
   *H01L 33/50* (2010.01)
   *H01L 33/56* (2010.01)

(52) U.S. Cl.
   CPC .......... *H01L 33/505* (2013.01); *H01L 33/56* (2013.01); *H01L 2933/0033* (2013.01); *H01L 2933/0041* (2013.01); *H01L 2933/0058* (2013.01)

(58) Field of Classification Search
   CPC ..... H01L 2933/0025; H01L 2933/0041; H01L 2933/0058; H01L 33/56; H01L 33/502; H01L 2933/0033
   See application file for complete search history.

(56) References Cited

U.S. PATENT DOCUMENTS

| | | | |
|---|---|---|---|
| 7,919,229 B2 | 4/2011 | Chao et al. | |
| 8,093,615 B2 | 1/2012 | Kim et al. | |
| 8,431,423 B2 | 4/2013 | Basin et al. | |
| 8,633,503 B2 | 1/2014 | Seo | |
| 8,877,528 B2 | 11/2014 | Ooyabu et al. | |
| 9,070,851 B2 | 6/2015 | Seo et al. | |
| 9,116,269 B2 | 8/2015 | Deschaseaux | |
| 9,190,398 B2 | 11/2015 | Tu et al. | |
| 9,257,617 B2 | 2/2016 | Bierhuizen | |
| 9,490,390 B2 | 11/2016 | Yoneda et al. | |
| 9,666,774 B2* | 5/2017 | Beppu | H01L 33/60 |
| 9,748,450 B2 | 8/2017 | Brandle et al. | |
| 9,871,174 B2* | 1/2018 | Cheng | H01L 33/52 |
| 10,147,843 B2 | 12/2018 | Epler et al. | |
| 10,249,802 B2 | 4/2019 | Baike et al. | |
| 11,063,192 B2 | 7/2021 | Tamaki et al. | |
| 11,127,887 B2 | 9/2021 | Masui et al. | |
| 11,424,396 B2* | 8/2022 | Saputra | H01L 33/486 |
| 2003/0146480 A1 | 8/2003 | Abiko | |
| 2008/0290351 A1* | 11/2008 | Ajiki | H01L 33/50 |
| | | | 257/E33.061 |
| 2010/0279437 A1* | 11/2010 | Neff | H01L 33/0095 |
| | | | 257/E21.532 |
| 2011/0254039 A1* | 10/2011 | Kim | H01L 33/50 |
| | | | 438/27 |
| 2012/0019922 A1 | 1/2012 | Deschaseaux | |
| 2012/0153330 A1 | 6/2012 | Tsutsui | |
| 2012/0248477 A1 | 10/2012 | Tischler et al. | |
| 2013/0260489 A1* | 10/2013 | Kwon | H01L 33/50 |
| | | | 257/E33.061 |
| 2013/0285064 A1* | 10/2013 | Kojima | H01L 33/44 |
| | | | 257/E33.025 |
| 2014/0231839 A1* | 8/2014 | Jeon | H01L 33/382 |
| | | | 257/96 |
| 2014/0362603 A1 | 12/2014 | Song et al. | |
| 2015/0050760 A1* | 2/2015 | Imazu | H01L 24/96 |
| | | | 438/27 |
| 2015/0129918 A1* | 5/2015 | Ikegami | H01L 33/507 |
| | | | 438/27 |
| 2015/0311405 A1* | 10/2015 | Oyamada | H01L 33/36 |
| | | | 438/27 |
| 2016/0123557 A1 | 5/2016 | Xu et al. | |
| 2016/0133807 A1* | 5/2016 | Hwang | H01L 33/382 |
| | | | 257/737 |
| 2017/0288095 A1 | 10/2017 | Cheng et al. | |

FOREIGN PATENT DOCUMENTS

| | | |
|---|---|---|
| EP | 3125310 | 2/2017 |
| JP | 2012-156443 | 8/2012 |
| KR | 10-2015-0062729 A | 6/2015 |
| WO | 2013/061228 | 5/2013 |
| WO | 2014/167455 | 10/2014 |
| WO | 2015/036887 | 3/2015 |
| WO | 2017/023502 | 2/2017 |

OTHER PUBLICATIONS

International Preliminary Report on Patentability Chapter I dated Jul. 3, 2018 for PCT International Application No. PCT/US2016/066413.
International Search Report dated Feb. 27, 2017 for PCT International Application No. PCT/US2016/066413.
Communication pursuant to Article 94(3) EPC dated Oct. 14, 2019 for European Patent Application No. 16819255.7.
Korean Office Action dated Oct. 16, 2023 for Korean Patent Application No. 10-2018-7021745.

* cited by examiner

FLIP CHIP LED WITH SIDE REFLECTORS ENCASING SIDE SURFACES OF A SEMICONDUCTOR STRUCTURE AND PHOSPHOR

CROSS-REFERENCE TO RELATED APPLICATIONS

This application is a continuation of U.S. patent application Ser. No. 16/067,016, filed Jun. 28, 2018, issued as U.S. Pat. No. 11,424,396, which is a § 371 application of International Application No. PCT/US2016/066413, filed Dec. 13, 2016, which claims priority to U.S. Provisional Patent Application No. 62/272,416 titled, "FLIP CHIP LED WITH SIDE REFLECTORS AND PHOSPHOR", filed Dec. 29, 2015 and European Patent Application No. EP16160421.0 titled, "FLIP CHIP LED WITH SIDE REFLECTORS AND PHOSPHOR", filed Mar. 15, 2016, which are incorporated by reference as if fully set forth.

FIELD OF THE INVENTION

This invention relates to packaged light emitting devices and, in particular, to a technique to reduce side emission in a phosphor-converted light emitting device.

BACKGROUND

As the footprint of light emitting devices becomes smaller, the ratio of the area of the top emission surface vs. the area of the side surfaces lowers. This means that a higher percentage of the emitted light is emitted from the sides of the semiconductor chip. For example, if a phosphor is deposited only over the top surface of a blue LED for generating white light, the resulting light emission will be a white spot surrounded by a blue halo.

Therefore, what is needed is a technique for packaging a light emitting device with phosphor over the top surface of the chip, where substantially all light is emitted from the top surface toward the phosphor.

SUMMARY

In the example of a blue flip-chip LED, where the blue light is to be converted to white light using a phosphor, a technique is disclosed wherein an array of LEDs is mounted on a support surface with the transparent growth substrate (e.g., sapphire) facing up. The growth substrate may be thinned and roughened by polishing for improving light extraction.

A photoresist layer, or other removable layer, is then deposited over the top surface of the growth substrate, followed by blanket-depositing a reflective material over the top and side surfaces of the LEDs to encapsulate the LEDs.

The top surfaces of the LEDs are then ground down to remove the reflective material over the top surface of the photoresist. The photoresist is then dissolved to leave a cavity over the growth substrate with reflective walls.

The cavity is then filled with a phosphor.

Thus, all side light is reflected back into the LED by the reflective material and eventually exits the LED toward the phosphor. Any side light from the phosphor is reflected back into the phosphor by the reflective walls of the cavity.

The phosphor-converted LEDs are then singulated to form packaged LEDs. The packaged LED, when energized, appears as a white dot with no side emission (i.e., no blue halo).

The technique is particularly beneficial for LEDs having a small footprint, where side emission is more problematic.

The above description is of one embodiment of the invention. Additional features and embodiments are described herein.

BRIEF DESCRIPTION OF THE DRAWINGS

Elements that are the same or similar are labeled with the same numeral.

DETAILED DESCRIPTION

Figure 1:
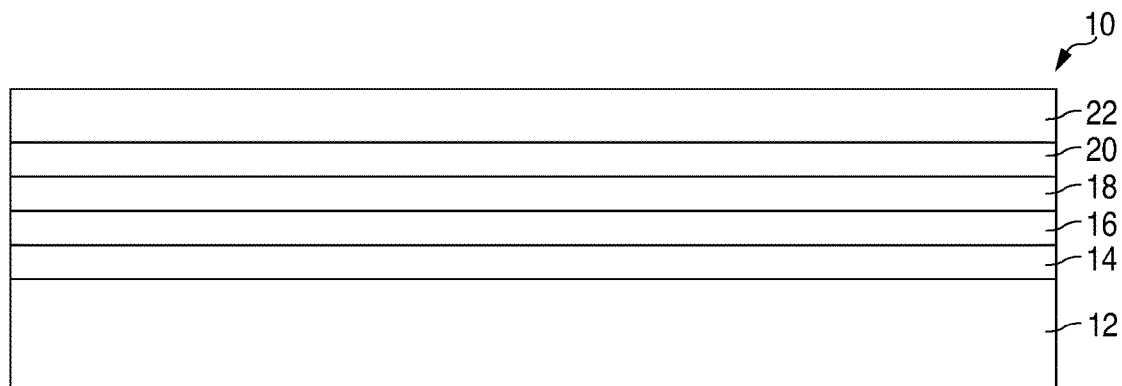
FIG. 1 is a cross-section of an LED wafer containing thousands of flip-chip LEDs. The LED wafer may be conventional. The individual anode and cathode metal pads for each LED are represented by a continuous top metal layer.

FIG. 1 is a cross-section of an LED wafer 10. A growth substrate 12 may be sapphire or other suitable growth substrate for LEDs. In the example of forming blue flip-chip LEDs, the growth substrate 12 may be a transparent sapphire substrate.

Over the growth substrate 12 is epitaxially grown a lattice matching layer 14, followed by one or more n-type layers 16, followed by a quantum well active layer 18, followed by one or more p-type layers 20, followed by a metal layer 22 that is patterned to form anode and cathode metal pads for each of the LEDs electrically contacting the p-type layers 20 and n-type layers 16, respectively.

The LED wafer 10 will typically contain thousands of flip-chip LEDs. The individual anode and cathode metal pads for each LED are represented by a continuous top metal layer 22. The LED wafer 10 may be conventional and well-known. Many other types of LED wafers and materials may be used with the present invention, since the invention is directed to packaging rather than to the particular epitaxial layers or growth substrate used in the LED. Although the invention is described for a light emitting diode, those skilled in the art will appreciate that the invention can be used with any light emitting semiconductor device where the light is emitted in more than one direction.

Figure 2:
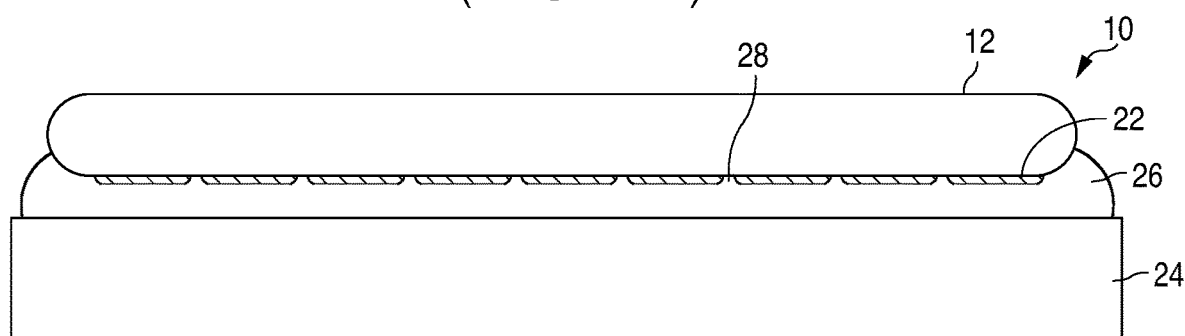
FIG. 2 is a cross-sectional view illustrating the LED wafer mounted on a temporary carrier, such as a glass wafer, using an adhesive, with the growth substrate (e.g., sapphire) facing up.

As shown in FIG. 2, the LED wafer 10 is then flipped over (with respect to FIG. 1) and adhesively secured to a temporary carrier 24, such as a glass wafer, via a UV-curable adhesive 26 or other suitable adhesive. The metal layer 22 of the LEDs is face down and the growth substrate 12 is face up. Indented areas 28 in the LED wafer 10 represent spaces between portions of the metal layer 22 on the bottom of each LED corresponding to singulation lines.

Figure 3:
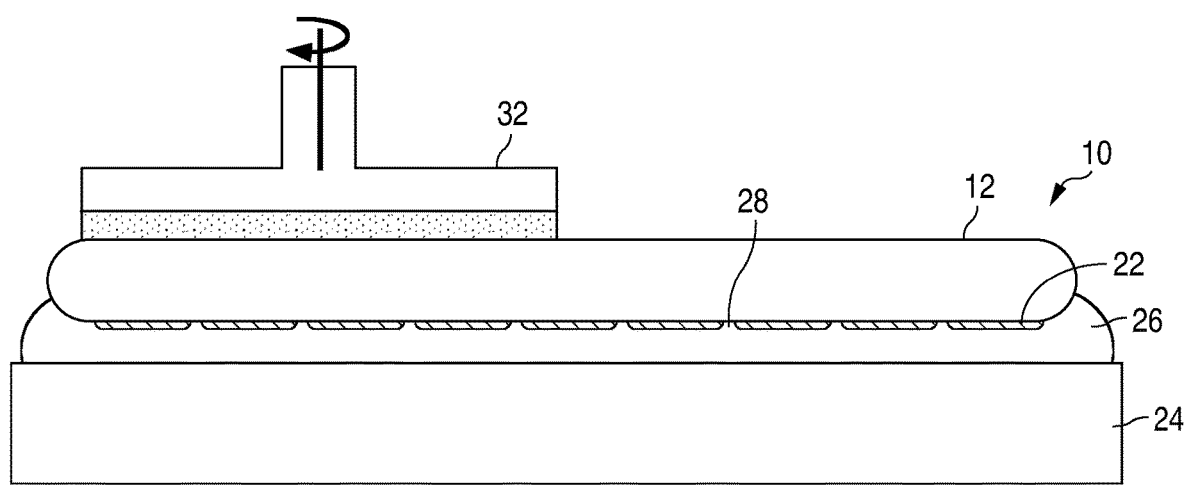
FIG. 3 illustrates the growth substrate being ground down for thinning and roughening.

As shown in FIG. 3, the growth substrate 12 is ground down by a conventional grinder wheel 32 to a desired thickness, such as to about 200 microns or less. Roughening and thinning the growth substrate 12 improves light extraction.

Figure 4:
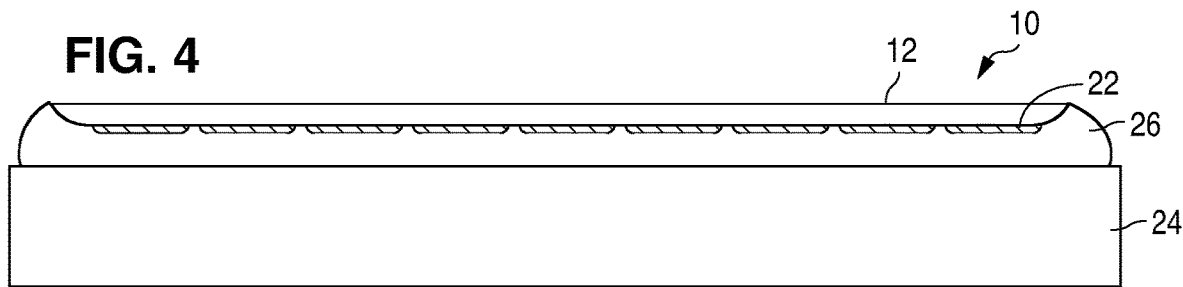
FIG. 4 illustrates the LED wafer after the growth substrate has been sufficiently ground down.

FIG. 4 illustrates the LED wafer 10 after the growth substrate 12 has been sufficiently ground down.

Figure 5:
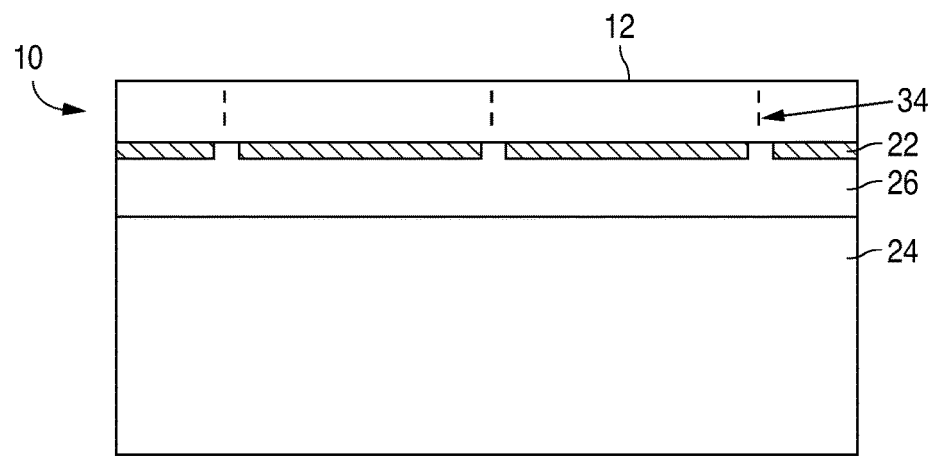
FIG. 5 illustrates partial dicing performed on the LED wafer to create cracks defining the edges of each LED.

FIG. 5 is a magnified view of a portion of the LED wafer 10 illustrating the creation of cracks 34 along the intended singulation lines as a result of "stealth dicing." Stealth dicing is a known technique that uses a focused laser to create cracks in a crystal along singulation lines. Other techniques can be used to weaken the growth substrate 12 along the singulation lines, such as scribing, partial sawing, or etching.

Figure 6:
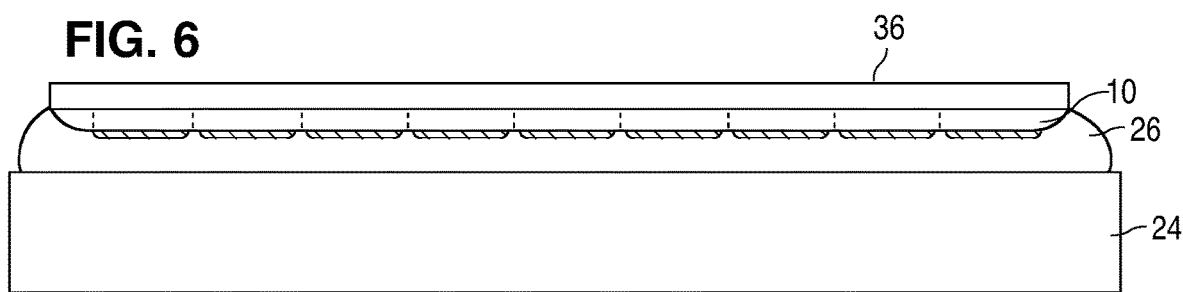
FIG. 6 illustrates a film of photoresist being applied to the top of the growth substrate.

FIG. 6 illustrates a photoresist film 36, such as BCB or BPO, laminated on, spun on, or otherwise deposited over the growth substrate 12 surface. The thickness of the photoresist film 36 coincides with the thickness of the phosphor layer to be later deposited. In one embodiment, the thickness of the photoresist film 36 will typically be 50-100 microns. The photoresist film 36 is a temporary layer that is later removed.

Figure 7:
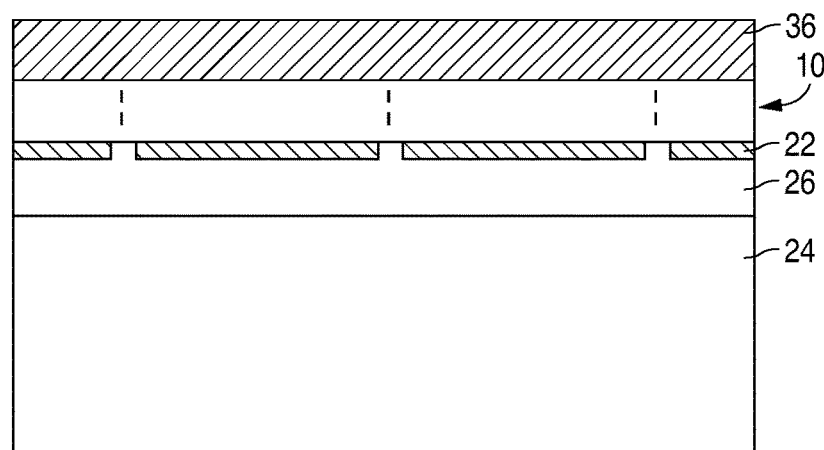
FIG. 7 illustrates the photoresist film in greater detail.

FIG. 7 illustrates the photoresist film 36 in greater detail. Materials other than a photoresist can be used, but the material should be dissolvable in a solvent or otherwise capable of being removed.

Figure 8:
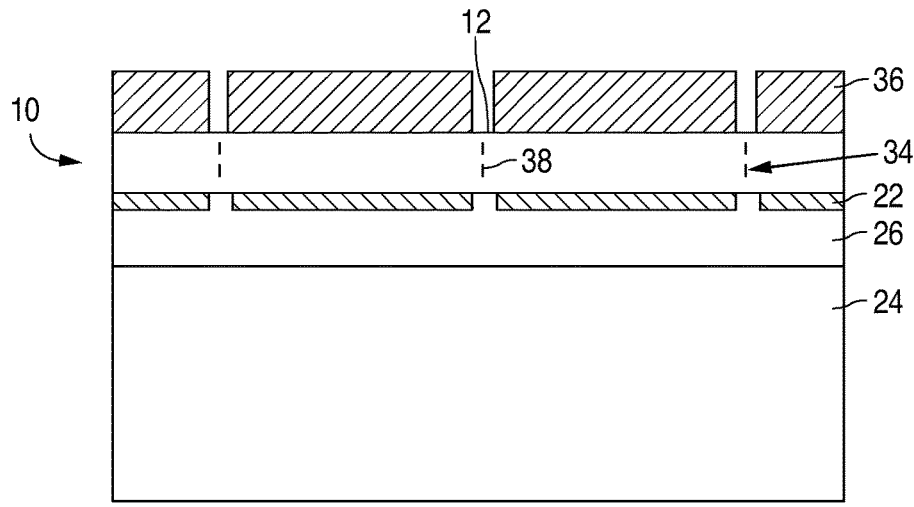
FIG. 8 illustrates the photoresist film patterned using a photolithographic process to expose the growth substrate along the intended singulation lines.

FIG. 8 illustrates the photoresist film 36 patterned using a photolithographic process (e.g., exposed to masked UV and developed) to expose the growth substrate 12 along the intended singulation lines 38.

Figure 9:
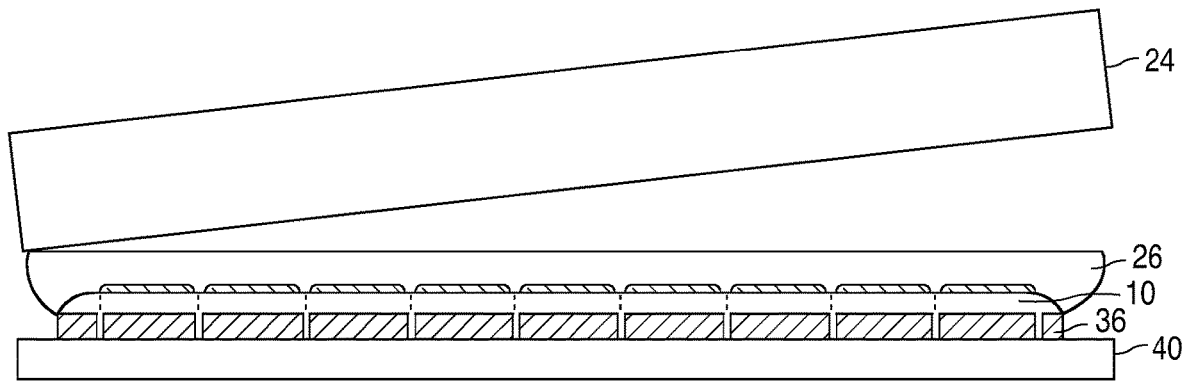
FIG. 9 illustrates the photoresist film surface being stuck on a mounting tape and the temporary carrier being removed from the adhesive.

FIG. 9 illustrates the photoresist film 36 surface being stuck on a mounting tape 40 and the temporary carrier 24 being removed from the adhesive 26. The adhesive 26 may be weak to allow the carrier 24 to be pulled off, or the adhesive 26 may be heated or partially dissolved to weaken it.

Figure 10:
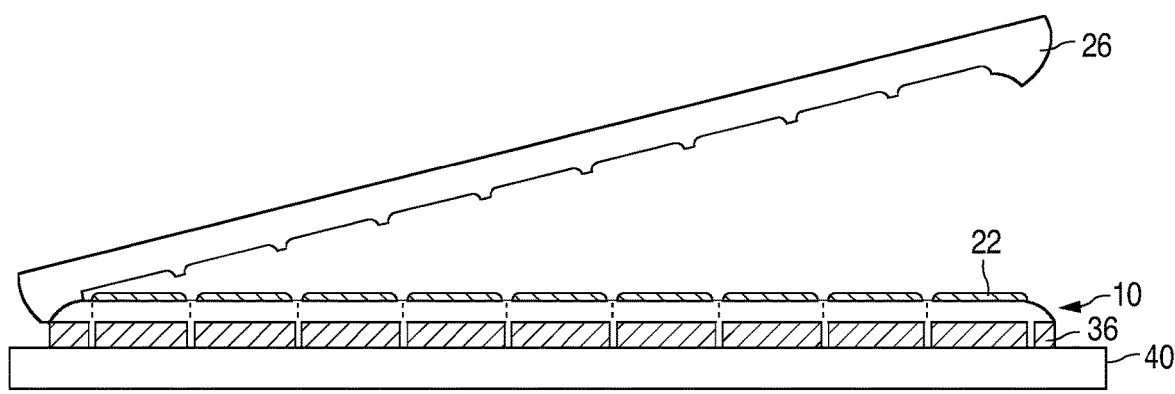
FIG. 10 illustrates the adhesive being removed to expose the metal contacts on the LED wafer.

FIG. 10 illustrates the adhesive 26 being removed to expose the metal layer 22 on the LED wafer 10. The adhesive 26 may be dissolved, heated, or weakened in another suitable way to avoid the adhesive 26 delaminating the metal layer 22 from the LED wafer 10.

Figure 11:
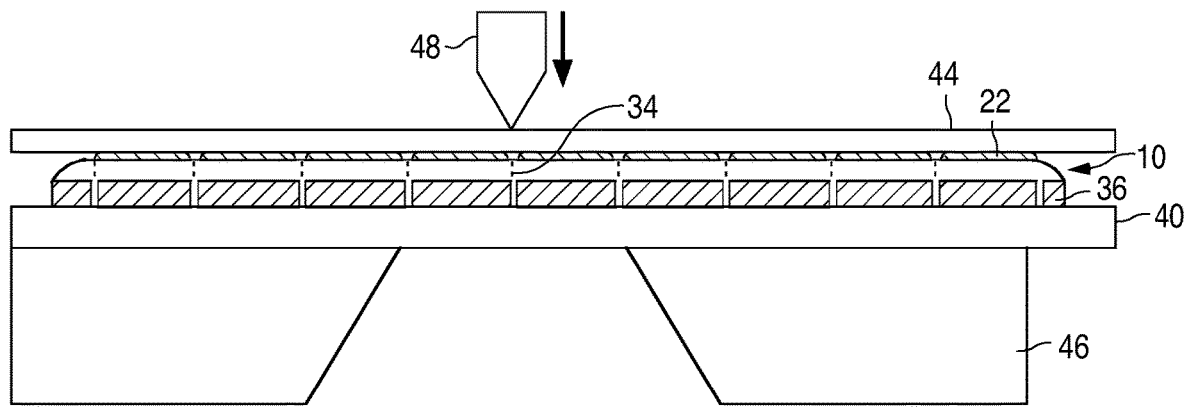
FIG. 11 illustrates the LED wafer being diced using a breaking process along the cracks formed in FIG. 5.

FIG. 11 illustrates a tacky Mylar tape 44 applied to the metal layer 22 for protection, followed by the LED wafer 10 being mounted on a conventional dicing surface 46 for breaking along the singulation lines 34. A sharp tool 48 presses on the singulation lines 34 that have been weakened by the stealth dicing in FIG. 5 and breaks the LED wafer 10 along the singulation lines 34.

Figure 12A:
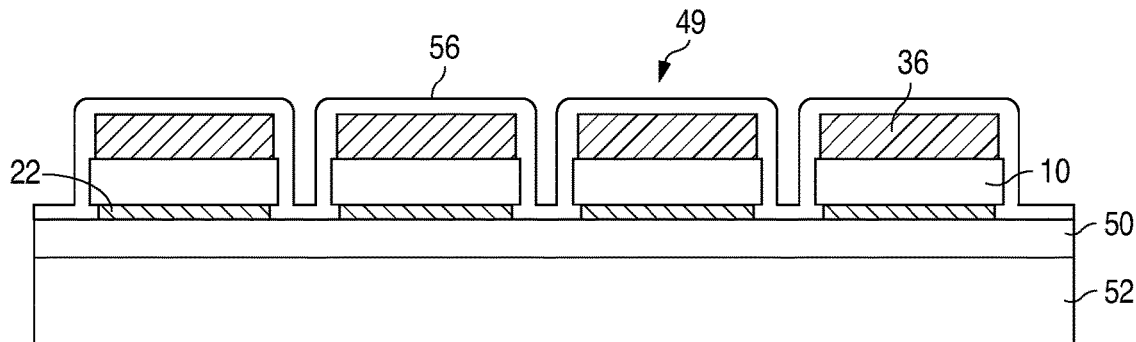
FIG. 12A illustrates how the singulated LEDs have been mounted on another temporary carrier, using a double-sided tape, with the photoresist film face up, and a reflective material, such as TiO2 particles in a transparent binder, being deposited to cover the tops and sides of the LEDs as well as the area between the LEDs.

As shown in FIG. 12A, the singulated LEDs 49, still adhered to the Mylar tape 44, are then removed from the dicing surface 46, and an automatic pick and place machine removes the LEDs 49 from the Mylar tape 44 and places them on a double-sided tacky tape 50. The tape 50 is adhered to another temporary carrier 52, which may be ceramic, glass, etc. Spaces are provided between the LEDs 49.

Then, a reflective material 56 is deposited over the tops and sides of the LEDs 49 to encapsulate them. The reflective material 56 may comprise reflective particles, such as TiO2, ZiO2, etc., in a transparent binder and deposited by spraying or other technique. Alternatively, the reflective particles may be deposited by electrophoresis. The thickness of the reflective material 56 is such that the amount of light that escapes the chip through the phosphor layer is maximized. Note that the reflective material 56 covers areas of the double-sided tacky tape 50 between the LEDs 49.

Figure 12B:
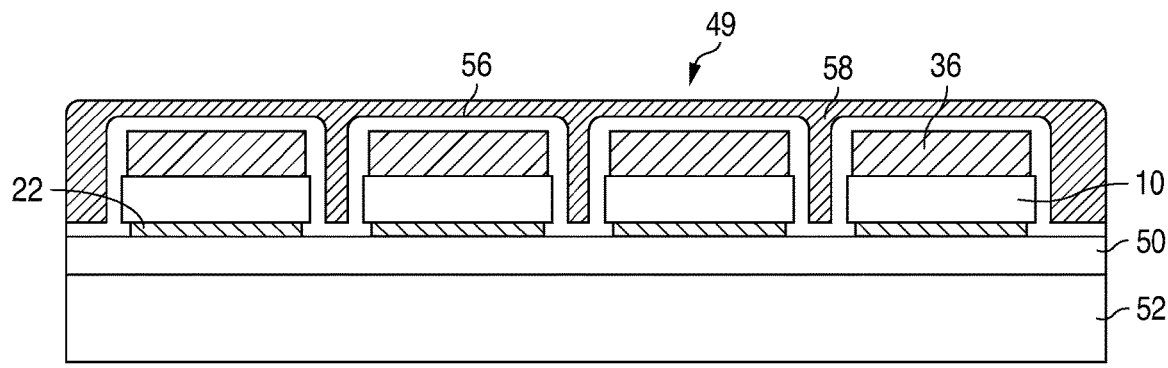
FIG. 12B illustrates an optional sheet molding compound (SMC), such as resin or silicone, deposited over and between the LEDs for forming a protective layer.

FIG. 12B illustrates an alternative embodiment where the structure is then covered with a protective layer 58, such as by molding a sheet molding compound (SMC). The protective layer 58 may be a resin or silicone deposited over and between the LEDs 49. This makes the LED structure more robust and may serve as a moisture barrier.

Figure 13A:
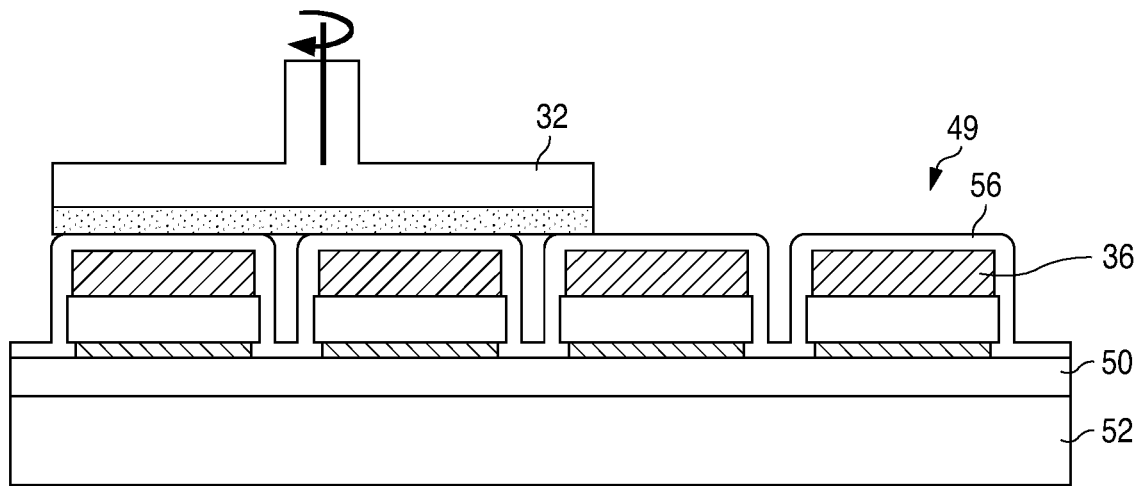
FIG. 13A illustrates the grinding down of the top surfaces of the LEDs in FIG. 12A to expose the photoresist film.

In FIG. 13A, a conventional grinder wheel 32 is used to grind down the top surface of the reflective material 56 from FIG. 12A to expose the photoresist film 36.

Figure 13B:
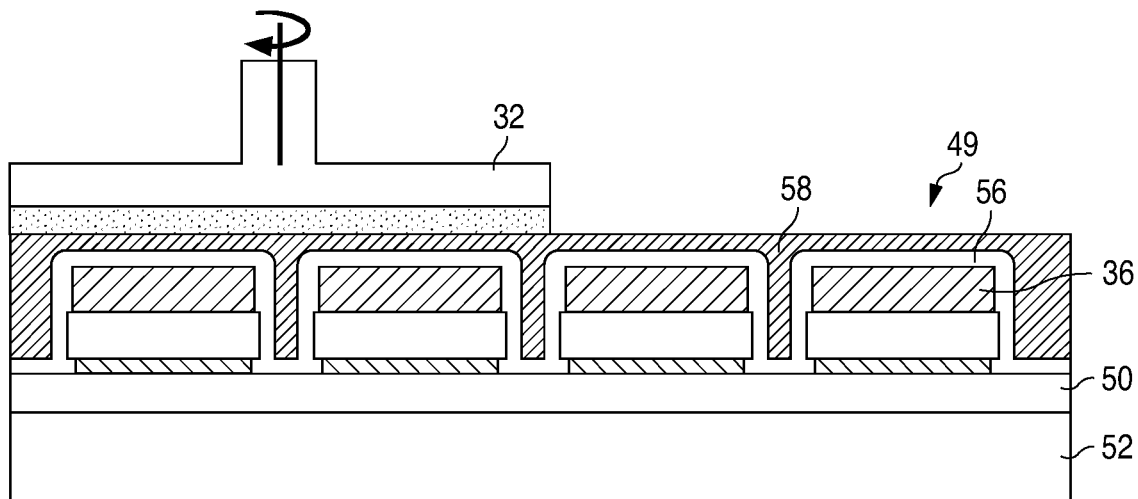
FIG. 13B illustrates the grinding down of the top surfaces of the LEDs in FIG. 12B to expose the photoresist film.

Alternatively, in FIG. 13B, the grinder wheel 32 is used to grind down the top surface of the reflective material 56 from FIG. 12B to expose the photoresist film 36.

After the photoresist film 36 is exposed, the structure is exposed to a solvent (e.g., dipped) to dissolve the photoresist film 36. Such solvents for the particular photoresist used are well-known.

Figure 14A:
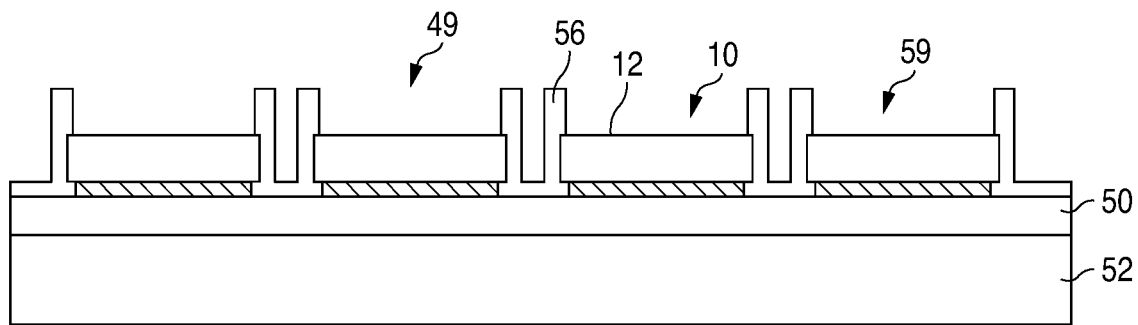
FIG. 14A illustrates the exposed photoresist film of FIG. 13A dissolved away with a solvent to form a reflective cavity over the growth substrate.
Figure 14B:
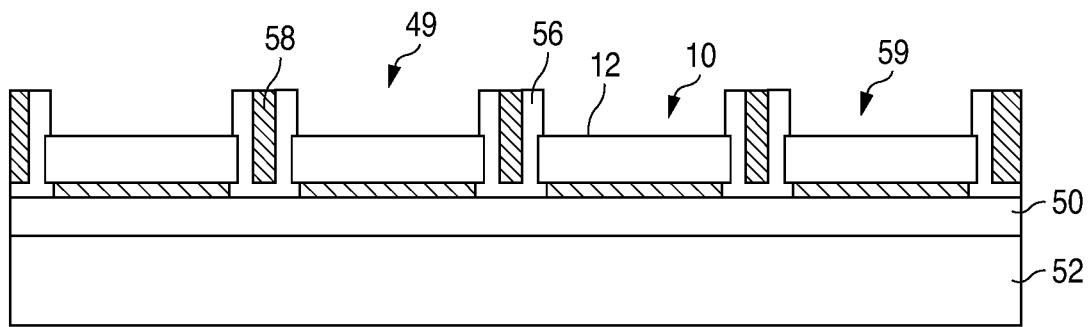
FIG. 14B illustrates the exposed photoresist film of FIG. 13B dissolved away with a solvent to form a reflective cavity over the growth substrate.

FIG. 14A illustrates the resulting structure after the photoresist film 36 of FIG. 13A has been dissolved, and FIG. 14B illustrates the resulting structure after the photoresist film 36 of FIG. 13B has been dissolved. The top surface of the growth substrate 12 is exposed. As seen, a cavity 59 is created surrounded by walls of the reflective material 56, where the depth of the cavity 59 is approximately equal to the thickness of the photoresist film 36 prior to being dissolved. Accordingly, the depth of the cavity 59 (which will be filled with a phosphor) can be precisely controlled by the thickness of the photoresist film 36, which is then used to precisely control the thickness of the phosphor layer for consistent color control.

Figure 15:
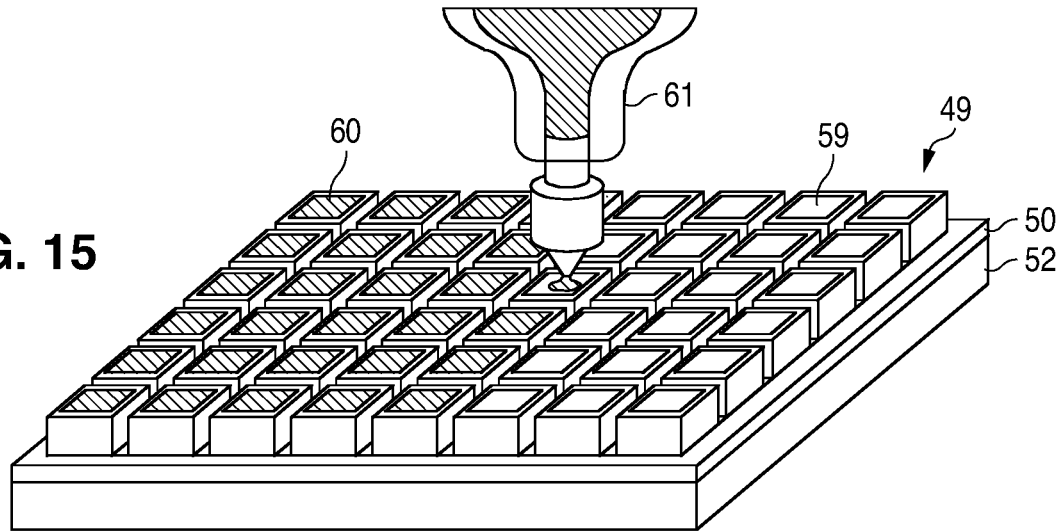
FIG. 15 is a perspective view of a carrier populated with LEDs and illustrates the filling of the reflective cavities with a phosphor, such as phosphor particles in a transparent binder.

In FIG. 15, a phosphor mixture 60 is injected into the cavities 59 using a nozzle 61 and may fill the cavities 59 to the top. The cavities 59 act as a mold so all the deposited phosphor mixture 60 for all the LEDs 49 have precisely the same shape for good color consistency. The amount of phosphor mixture 60 may be pre-measured for each LED 49, or an optical feedback mechanism may be used to fill each cavity 59 to the top.

The phosphor mixture 60 is then cured, such as by heat or UV light. The phosphor mixture 60 may be phosphor particles in a transparent binder, such as silicone. The density and thickness of the cured phosphor mixture 60 determines the amount of wavelength conversion of the blue light, since some blue light passes through the phosphor mixture 60 without being converted. For example, the phosphor may be a yellow YAG phosphor which, when mixed with blue light, creates white light. Any other color light may be generated by selecting one or more light converting materials.

Figure 16A:
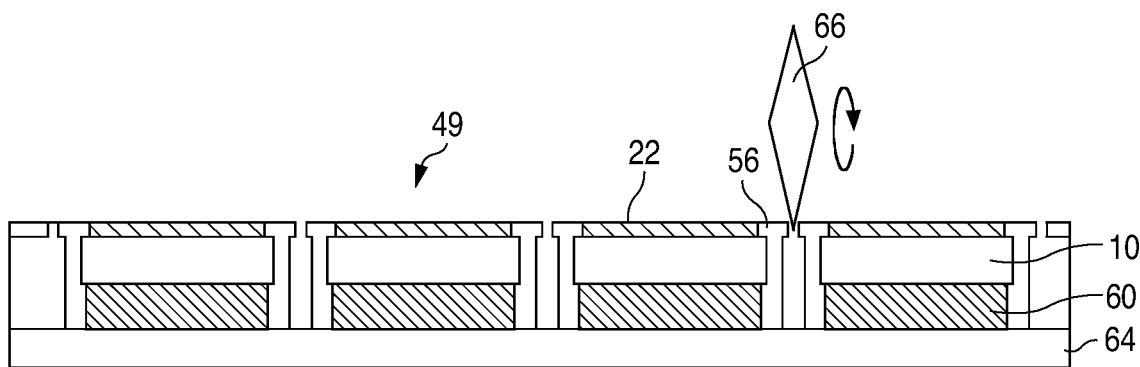
FIG. 16A is a cross-sectional view of the structure of FIG. 15, without the SMC of FIG. 12B, after the phosphor mixture has been cured, where the structure has been flipped over and mounted on a tape (phosphor side down), followed by a sawing or breaking process to separate any residual reflective material between the LED dies.

The tops of the LEDs 49 are then affixed to another tacky tape 64 in FIG. 16A (phosphor mixture 60 on bottom), and the bottoms of the LEDs 49 (metal layer 22) are then removed from the double-sided tacky tape 50. Thus, the portion of the reflective material 56 that was deposited between the LEDs 49 is now on top.

FIG. 16A illustrates the cutting of these connecting portions of the reflective material 56 with a dicing saw 66 to complete the full singulation of the LEDs 49.

Figure 16B:
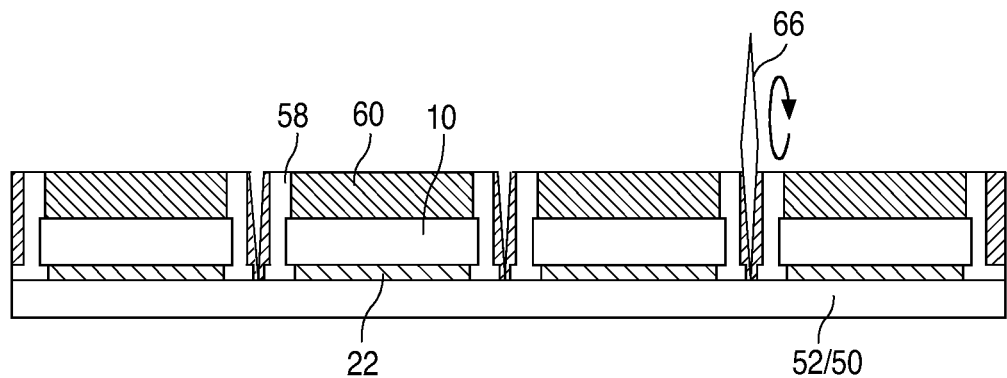
FIG. 16B is a cross-sectional view of the structure of FIG. 15, with the SMC of FIG. 12B, after the phosphor mixture has been cured, where a sawing process separates any residual reflective material and the SMC between the LED dies.

FIG. 16B illustrates a process performed on the structure having the protective layer 58 molded between the LEDs 49. In such a case, the layer of LEDs 49 on the double-sided tacky tape 50 can remain on the tape 50 while the reflective material 56 and protective layer 58 between the LEDs 49 is being sawed since the saw 66 must cut through the entire thickness down to the tape 50 to complete the singulation.

The packaged LEDs 49 may then be picked from the tape 50 or 64 and mounted on a printed circuit board or submount to connect the flip-chip anode and cathode bottom electrodes (part of the metal layer 22) to a power source.

Figure 17:
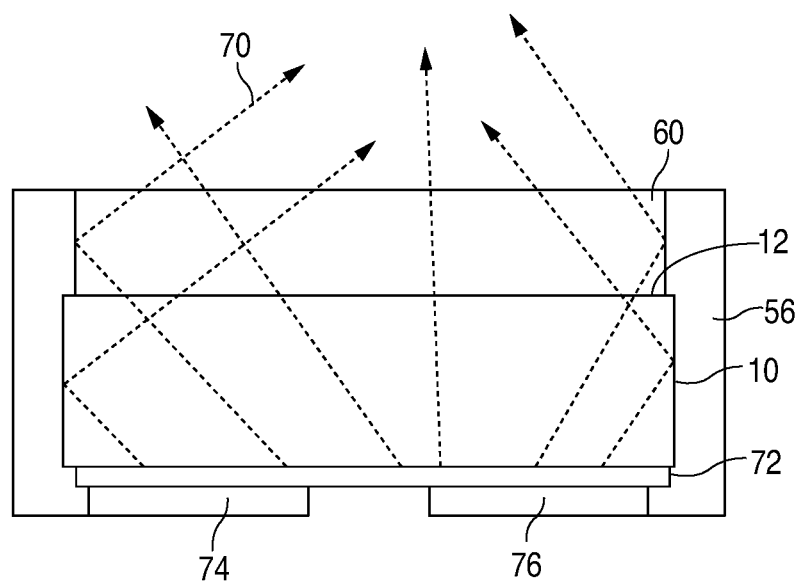
FIG. 17 illustrates a single phosphor-converted flip-chip LED, after removal from the tape in FIG. 16A or 16B, showing how the light rays generated by the active layer and the phosphor are reflected by the reflective material such that all light exits the top surface.

FIG. 17 shows a single energized LED 49 in more detail where light rays 70 emitted from the LED semiconductor layers 72 either directly impinge or pass through the phosphor mixture 60 or reflect off the reflective material 56 forming a wall around the entire LED 49. Side light from the phosphor mixture 60 is also redirected by the reflective material 56. Also shown is the growth substrate 12, the anode electrode 74, and the cathode electrode 76 (as part of the metal layer 22).

Typical sizes of the LED 49 are between 100 microns and 1 mm per side. Virtually 100% of the side light emitted by the LED 49 is directed back into the LED 49 or through the top surface of the LED 49. Therefore, the energized LED appears as a tiny white dot with no blue halo. Any other color may be created.

Quantum dots or a mixture of quantum dots and phosphors may be also used instead of the phosphor mixture 60. Other types of wavelength converting materials are also contemplated by the invention.

In another embodiment, the growth substrate 12 may be removed after the LED semiconductor layers are formed, and another transparent substrate is affixed to the LED semiconductor layers. Accordingly, the term "substrate" may apply to either type of substrate.

Many variations of the described process may be employed while still forming the reflective walls around the LED 49 (for reflecting side light) and creating the reflective cavity 59 (for filling with a wavelength-conversion material). For example, some steps may not be needed for a particular application. Further, additional steps and layers may be added depending on the particular application. In some cases, the step of grinding may be performed by etching, laser ablation, or other techniques. The phosphor mixture may instead be a pre-formed phosphor tile that is placed into the cavity 59.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light-emitting diode (LED) device comprising:
a semiconductor structure comprising a top surface, a bottom surface opposite the top surface, and a plurality of side surfaces;
a wavelength-converting structure over the top surface of the semiconductor structure, the wavelength-converting structure having a top surface, a bottom surface opposite the top surface, and a plurality of side surfaces;
at least two electrodes electrically coupled to the semiconductor structure via the bottom surface of the semiconductor structure;
a reflective layer completely encasing the plurality of side surfaces of both the semiconductor structure and the wavelength-converting structure and extending to the top surface of the wavelength-converting structure, wherein the reflective layer has a top surface, a bottom surface opposite the top surface, and a plurality of side surfaces; and
a protective layer encasing the side surfaces of the reflective layer.

2. The LED device of claim 1, wherein the wavelength-converting structure does not extend above the reflective layer.

3. The LED device of claim 1, further comprising a transparent substrate between the semiconductor structure and the wavelength-converting structure.

4. The LED device of claim 3, wherein the wavelength-converting structure does not overlie the reflective layer over the plurality of side surfaces of the transparent substrate and semiconductor structure.

5. The LED device of claim 3, wherein the wavelength-converting structure has a thickness of 50 to 100 microns.

6. The LED device of claim 5, wherein:
the transparent substrate comprises a top surface, a bottom surface opposite the top surface, and a plurality of side surfaces, and
the reflective layer extends beyond the top surface of the transparent substrate the same distance as the thickness of the wavelength-converting structure.

7. The LED device of claim 1, wherein a size of the LED device is between 100 microns and 1 mm per side.

8. The LED device of claim 1, wherein the reflective layer has a thickness that reflects approximately 100% of light emitted from the plurality of side surfaces of the semiconductor structure during operation of the LED device back into the LED device or through a top surface of the LED device.

9. The LED device of claim 1, wherein the protective layer is one of resin or silicone.

10. The LED device of claim 1, wherein the wavelength-conversion material is one of phosphor particles in a transparent binder, a pre-formed phosphor-containing tile, quantum dots, or a mixture of quantum dots and phosphor.

11. The LED device of claim 1, wherein the reflective material comprises reflective particles or reflective particles in a transparent binder.

12. The LED device of claim 11, wherein the reflective particles are particles of at least one of $TiO_2$ or $ZiO_2$.

13. A semiconductor device comprising:
   a temporary substrate comprising a top surface and a bottom surface opposite the top surface;
   a plurality of light-emitting diode (LED) devices spaced apart from one another on the temporary substrate, each of the plurality of LED devices comprising at least:
      a semiconductor structure comprising a top surface, a bottom surface opposite the top surface, and a plurality of side surfaces, and
      a photoresist material on the semiconductor structure such that the semiconductor structure is between the photoresist material and the temporary substrate, the photoresist material having a top surface, a bottom surface opposite the top surface, and a plurality of side surfaces, wherein a height of the photoresist material corresponds to a height of a wavelength converting structure to be disposed in place of the photoresist material; and
   a layer of a reflective material covering at least: the plurality of side surfaces of the photoresist material, the plurality of side surfaces of the semiconductor structure, and the top surface of the temporary substrate.

14. The semiconductor structure of claim 13, wherein the layer of the reflective material does not completely fill spaces between the plurality of LED devices.

15. The semiconductor structure of claim 13, wherein the layer of the reflective material has approximately the same thickness in all locations.

16. The semiconductor structure of claim 13, wherein the photoresist material has approximately the same thickness and shape on each of the plurality of LED devices.

17. The semiconductor structure of claim 13, further comprising a protective layer covering the top surface of the reflective material and filling spaces between the plurality of LEDs that is not filled by the reflective material.

18. The semiconductor structure of claim 13, wherein the photoresist material has a thickness equal to a desired thickness of a wavelength converting material for the LED device.

19. The semiconductor structure of claim 13, wherein the reflective layer completely encases the plurality of side surfaces of both the semiconductor structure and the photoresist material and extends at least to the top surface of the photoresist material.

* * * * *